United States Patent
Ellis-Monaghan et al.

(10) Patent No.: US 11,949,034 B2
(45) Date of Patent: Apr. 2, 2024

(54) PHOTODETECTOR WITH DUAL DOPED SEMICONDUCTOR MATERIAL

(71) Applicant: GLOBALFOUNDRIES U.S. Inc., Malta, NY (US)

(72) Inventors: John J. Ellis-Monaghan, Grand Isle, VT (US); Rajendran Krishnasamy, Essex Junction, VT (US); Siva P. Adusumilli, South Burlington, VT (US); Ramsey Hazbun, Colchester, VT (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 34 days.

(21) Appl. No.: 17/849,285

(22) Filed: Jun. 24, 2022

(65) Prior Publication Data
US 2023/0420596 A1 Dec. 28, 2023

(51) Int. Cl.
| | | |
|---|---|---|
| *H01L 31/105* | (2006.01) | |
| *H01L 31/0288* | (2006.01) | |
| *H01L 31/18* | (2006.01) | |
| H01L 31/0216 | (2014.01) | |

(52) U.S. Cl.
CPC ........ *H01L 31/105* (2013.01); *H01L 31/0288* (2013.01); *H01L 31/1804* (2013.01); *H01L 31/0216* (2013.01)

(58) Field of Classification Search
CPC .............. H01L 31/105; H01L 31/0288; H01L 31/1804; H01L 31/0216
See application file for complete search history.

(56) References Cited

U.S. PATENT DOCUMENTS

| | | | |
|---|---|---|---|
| 2,557,110 | A | 6/1951 | Jaynes |
| 2,619,538 | A | 11/1952 | Grant |
| 3,787,871 | A | 1/1974 | Reese |
| 4,481,523 | A | 11/1984 | Osaka |
| 4,799,031 | A | 1/1989 | Lang et al. |
| 4,847,210 | A | 7/1989 | Wang et al. |
| 5,625,210 | A | 4/1997 | Lee et al. |
| 5,880,495 | A | 3/1999 | Chen |

(Continued)

FOREIGN PATENT DOCUMENTS

| | | |
|---|---|---|
| EP | 1982356 | 3/2017 |
| KR | 20100070601 | 6/2010 |

(Continued)

OTHER PUBLICATIONS

Fossum et al., "A Review of the Pinned Photodiode for CCD and CMOS Image Sensors", IEEE Journal of the Electron Devices Society, May 2014, vol. 2, No. 3, 11 pages.

(Continued)

*Primary Examiner* — Sitaramarao S Yechuri
(74) *Attorney, Agent, or Firm* — Anthony Canale; Andrew M. Calderon; Calderon Safran & Cole, P.C.

(57) ABSTRACT

The present disclosure relates to semiconductor structures and, more particularly, to a photodetector and methods of manufacture. The structure includes: a photodetector; and a semiconductor material on the photodetector, the semiconductor material comprising a first dopant type, a second dopant type and intrinsic semiconductor material separating the first dopant type from the second dopant type.

20 Claims, 6 Drawing Sheets

(56) References Cited

U.S. PATENT DOCUMENTS

| | | | |
|---|---|---|---|
| 5,994,724 A * | 11/1999 | Morikawa | H01L 31/035281 |
| | | | 257/466 |
| 6,147,349 A | 11/2000 | Ray | |
| 6,180,945 B1 | 1/2001 | Barton et al. | |
| 6,218,210 B1 | 4/2001 | Park | |
| 6,921,934 B2 | 7/2005 | Patkick | |
| 7,002,429 B2 | 2/2006 | Asao et al. | |
| 7,361,526 B2 | 4/2008 | Maa et al. | |
| 7,397,101 B1 | 7/2008 | Masini et al. | |
| 7,618,839 B2 | 11/2009 | Rhodes | |
| 7,777,250 B2 | 8/2010 | Lochtefeld | |
| 7,790,495 B2 | 9/2010 | Assefa et al. | |
| 7,795,064 B2 | 9/2010 | Pan et al. | |
| 7,871,854 B1 * | 1/2011 | Spencer | H01L 31/1804 |
| | | | 438/273 |
| 7,902,540 B2 | 3/2011 | Cohen | |
| 9,064,699 B2 | 6/2015 | Wang et al. | |
| 9,711,550 B2 | 7/2017 | FaVennec et al. | |
| 9,864,138 B2 | 1/2018 | Coolbaugh et al. | |
| 10,074,687 B2 | 9/2018 | Kurokawa | |
| 10,157,947 B2 | 12/2018 | Chen et al. | |
| 10,359,569 B2 | 7/2019 | Dumais | |
| 10,861,888 B2 | 12/2020 | Na et al. | |
| 11,004,878 B2 | 5/2021 | Stamper et al. | |
| 11,079,544 B2 | 8/2021 | Bian et al. | |
| 11,125,944 B2 | 9/2021 | Bian et al. | |
| 2003/0030814 A1 | 2/2003 | Osinski et al. | |
| 2007/0099315 A1 | 5/2007 | Maa et al. | |
| 2008/0070355 A1 | 3/2008 | Lochtefeld et al. | |
| 2008/0257409 A1 | 10/2008 | Li et al. | |
| 2009/0173976 A1 * | 7/2009 | Augusto | H01L 27/14669 |
| | | | 257/292 |
| 2010/0026192 A1 * | 2/2010 | Hadwen | G01J 1/44 |
| | | | 257/443 |
| 2011/0037133 A1 | 2/2011 | Su et al. | |
| 2012/0213468 A1 | 8/2012 | Lipson et al. | |
| 2012/0313201 A1 * | 12/2012 | Hebert | G02B 5/285 |
| | | | 257/E31.127 |
| 2013/0149806 A1 | 6/2013 | Kim et al. | |
| 2013/0241021 A1 | 9/2013 | Stenson | |
| 2014/0159183 A1 | 6/2014 | Na | |
| 2014/0185979 A1 | 7/2014 | Evans et al. | |
| 2014/0217269 A1 | 8/2014 | Guo et al. | |
| 2015/0075599 A1 | 3/2015 | Yu | |
| 2015/0097256 A1 | 4/2015 | Ang et al. | |
| 2015/0115333 A1 | 4/2015 | Bobde et al. | |
| 2016/0155884 A1 | 6/2016 | Hon et al. | |
| 2017/0365636 A1 | 12/2017 | Mazzillo et al. | |
| 2018/0061883 A1 * | 3/2018 | Na | H01L 27/14652 |
| 2018/0204761 A1 | 7/2018 | Feilchenfeld et al. | |
| 2020/0020734 A1 | 1/2020 | Wang et al. | |
| 2020/0105812 A1 | 1/2020 | Sze | |
| 2021/0320217 A1 | 10/2021 | Levy et al. | |
| 2021/0376180 A1 | 12/2021 | Adusumilli | |
| 2022/0029032 A1 | 1/2022 | Levy et al. | |

FOREIGN PATENT DOCUMENTS

| | | |
|---|---|---|
| KR | 20100070610 | 6/2010 |
| WO | 0147034 | 6/2001 |

OTHER PUBLICATIONS

Yu, "High-Efficiency p-i-n Photodetectors on Selective-Area-Grown Ge for Monolithic Integration", IEEE Electron Device Letters, vol. 30, Issue 11, Nov. 2009, 4 pages.

Knoll, "High-Performance BiCMOS Si Photonics Platform", IEEE, 2015, 8 pages.

Liao et al., "36 GHz submicron silicon waveguide germanium photodetector", Optics Express, vol. 19, Issue 11, May 20, 2011, 6 pages.

Huang et al., "Germanium on Silicon Avalanche Photodiode", IEEE Journal of Selected Topics in Quantum Electronics vol. 24, No. 2, Mar./Apr. 2018, 11 pages.

Jutzi et al., "Ge-on-Si Vertical Incidence Photodiodes With 39-GHz Bandwidth", IEEE Photonics Technology Letters, vol. 17, Issue 7, Jul. 2005, 3 pages.

Koester et al., "Germanium-On-Insulator Photodetectors", IEEE, Oct. 2005, 3 pages.

* cited by examiner

US 11,949,034 B2

PHOTODETECTOR WITH DUAL DOPED SEMICONDUCTOR MATERIAL

BACKGROUND

The present disclosure relates to semiconductor structures and, more particularly, to a photodetector and methods of manufacture.

Photodetectors are sensors of light or other electromagnetic radiation. Semiconductor based photodetectors typically have a PN junction that converts light photons into current. The absorbed photons make electron—hole pairs in the depletion region. The PN junction of a photodetector is reverse biased so only a very small reverse saturation current flows through the photodetector without an input optical signal.

Photodetectors have a number of performance metrics, also called figures of merit, by which photodetectors can be characterized and compared. One such metric is dark current. Dark current is the current flowing through a photodetector even in the absence of light. Also, photodetectors can generate noises in the process, which is detrimental to performance. One such noise is dark-current noise, which can be reduced by decreasing the reverse saturation current through material improvement and junction structure optimization.

SUMMARY

In an aspect of the disclosure, a structure comprises: a photodetector; and a semiconductor material on the photodetector, the semiconductor material comprising a first dopant type, a second dopant type and intrinsic semiconductor material separating the first dopant type from the second dopant type.

In an aspect of the disclosure, a structure comprising: a semiconductor substrate; an insulator material over the semiconductor substrate; a photodetector within a trench of the semiconductor substrate; a semiconductor material of a first dopant type on a first portion of the photodetector; a semiconductor material of a second dopant type on a second portion of the photodetector; and an intrinsic semiconductor material on a third portion of the photodetector.

In an aspect of the disclosure, a method comprises: forming a photodetector in a semiconductor substrate; and forming a semiconductor material on the photodetector, the semiconductor material comprising a first dopant type, a second dopant type and intrinsic semiconductor material separating the semiconductor material of the first dopant type from the semiconductor material of the second dopant type.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a photodetector and methods of manufacture. More specifically, the photodetector may be a Ge photodetector with a dual doped polysilicon or silicon material separated by an intrinsic region on top of the Ge material. Advantageously, the photodetector provides improved DC (dark current) and AC (frequency vs. QE) performance.

The photodetector of the present disclosure can be manufactured in a number of ways using a number of different tools. In general, though, the methodologies and tools are used to form structures with dimensions in the micrometer and nanometer scale. The methodologies, i.e., technologies, employed to manufacture the photodetector of the present disclosure have been adopted from integrated circuit (IC) technology. For example, the structures are built on wafers and are realized in films of material patterned by photolithographic processes on the top of a wafer. In particular, the fabrication of the photodetector uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1:
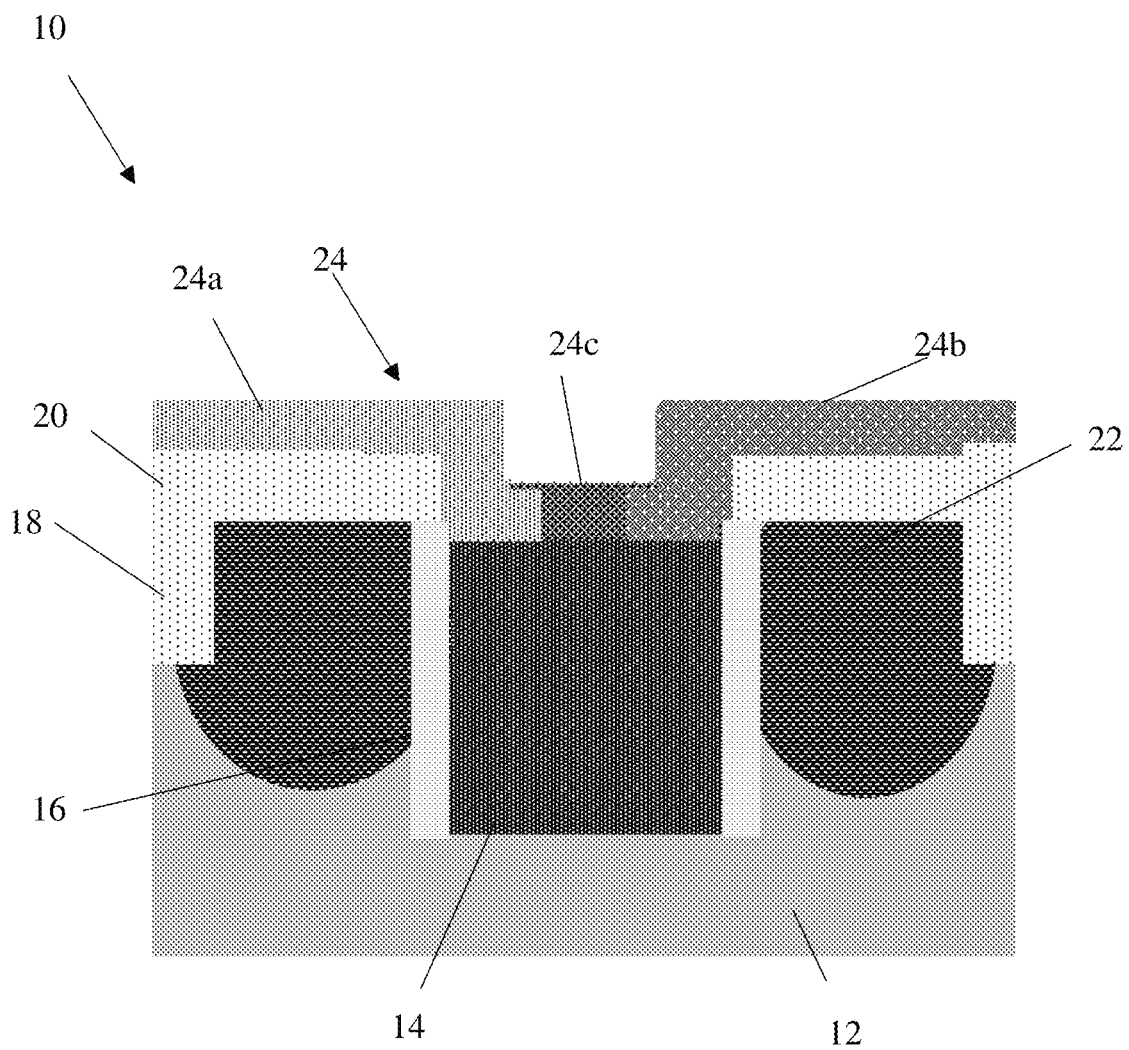
FIG. 1 shows a photodetector with doped sidewalls in accordance with aspects of the present disclosure.

FIG. 1 shows a photodetector in accordance with aspects of the present disclosure. More specifically, the structure 10 of FIG. 1 includes a semiconductor substrate 12 with a photodetector 14. In embodiments, the semiconductor substrate 12 may be composed of any suitable material including, but not limited to, Si. In further embodiments, the semiconductor substrate 12 may comprise any suitable crystallographic orientation (e.g., a (100), (110), (111), or (001) crystallographic orientation).

The photodetector 14 may be composed of Ge material, for example. In embodiments, the Ge material 12 may be intrinsic Ge material provided within a trench of the semiconductor substrate 12. A collar 16 may surround the photodetector 14, i.e., line the trench of the semiconductor substrate 12. In this way, the collar 16 may abut the photodetector and may be provided between the photodetector 14 and the semiconductor substrate 12. In embodiments, the collar 16 may be insulator material, e.g., oxide.

Still referring to FIG. 1, shallow trench isolation structures 18 may be provided within the semiconductor substrate 12 on sides of the photodetector 14. An insulator material 20 may be provided over the semiconductor substrate 12. In embodiments, the insulator material 20 may be an oxide material. Optional doped regions 22 may be provided in the semiconductor substrate 12 under the insulator material 20. The optional doped regions 22 may be p-doped regions or n-doped regions, which are isolated from the photodetector 14 by the collar 16. The optional doped regions 22 may be isolated from other structures by the shallow trench isolation structures 18. The optional n-doped regions 22 may be biased to provide the lowest dark current.

A semiconductor material 24 is provided over the photodetector 14 and the insulator material 20. In embodiments, the semiconductor material 24 may be epitaxially grown semiconductor material in direct contact with the photodetector 14 and the insulator material 20. As should be understood by those of skill in the art, the semiconductor material 24 may be polysilicon over the insulator material 20 and epitaxial silicon and polysilicon over the photodetector 14.

The semiconductor material 24 includes a first doped region 24a, a second doped region 24b and an intrinsic region 24c between the first doped region 24a and the second doped region 24b. In this way, a dual doped polysilicon/silicon region separated by an intrinsic region is provided on the top of the photodetector 14. In embodiments, the first doped region 24a may be a P+ doped region (e.g., boron or gallium) and the second doped region 24b may be an N+ doped region (e.g., arsenic or phosphorus). In this way, the semiconductor material 24 over the photodetector 14 may be a PiN photodiode (e.g., P+ polysilicon, intrinsic Si and N+ polysilicon).

Figure 2:
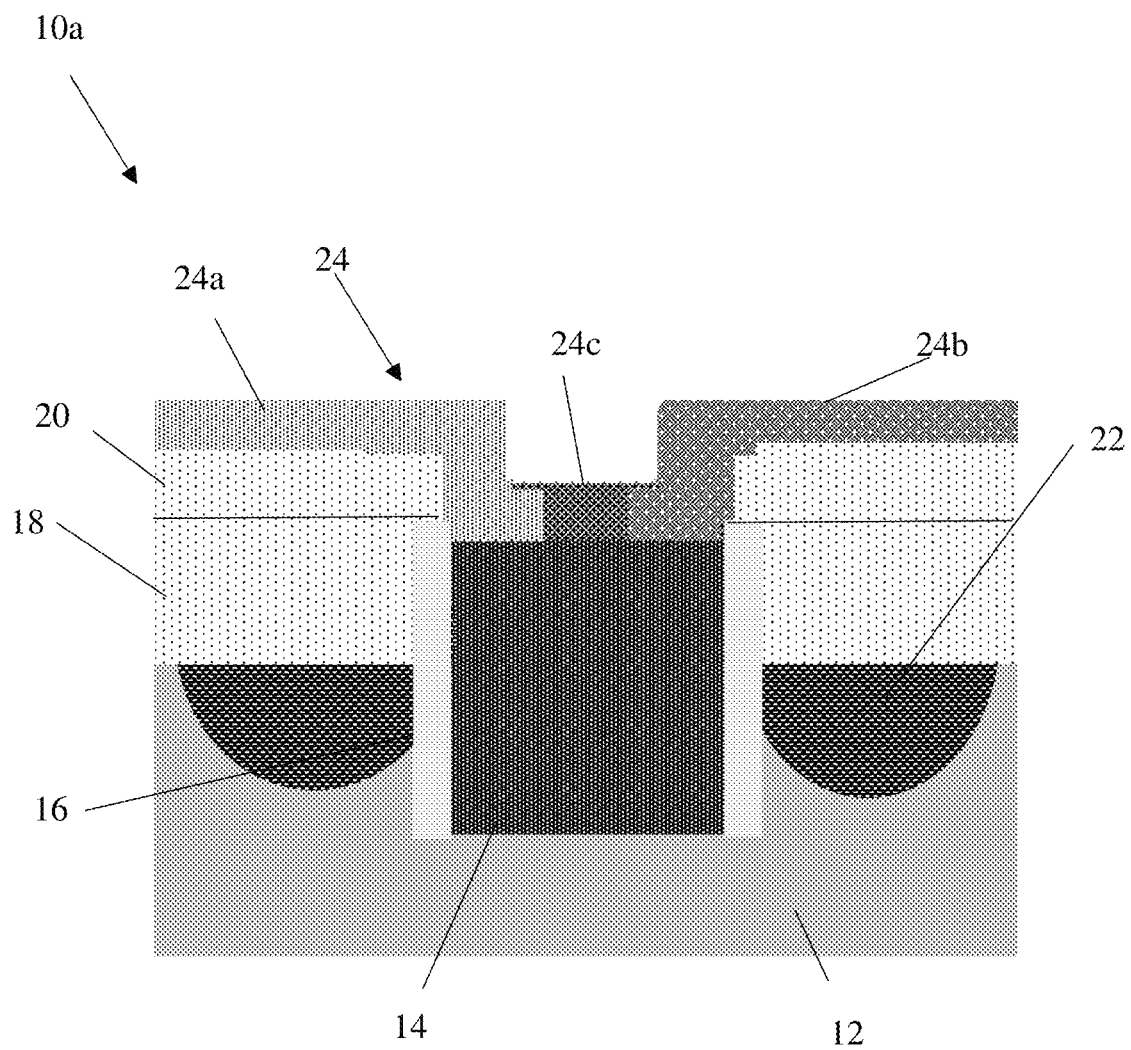
FIG. 2 shows a photodetector with doped sidewalls in accordance with additional aspects of the present disclosure.

FIG. 2 shows a photodetector with doped sidewalls in accordance with additional aspects of the present disclosure. In the structure 10a of FIG. 2, the shallow trench isolation structures 18 abut the collar 16. In addition, in this embodiment, the doped regions 22 may extend underneath the shallow trench isolation structures 18 within the semiconductor substrate 12. The remaining features are similar to the structure 10 of FIG. 1.

Figure 3:
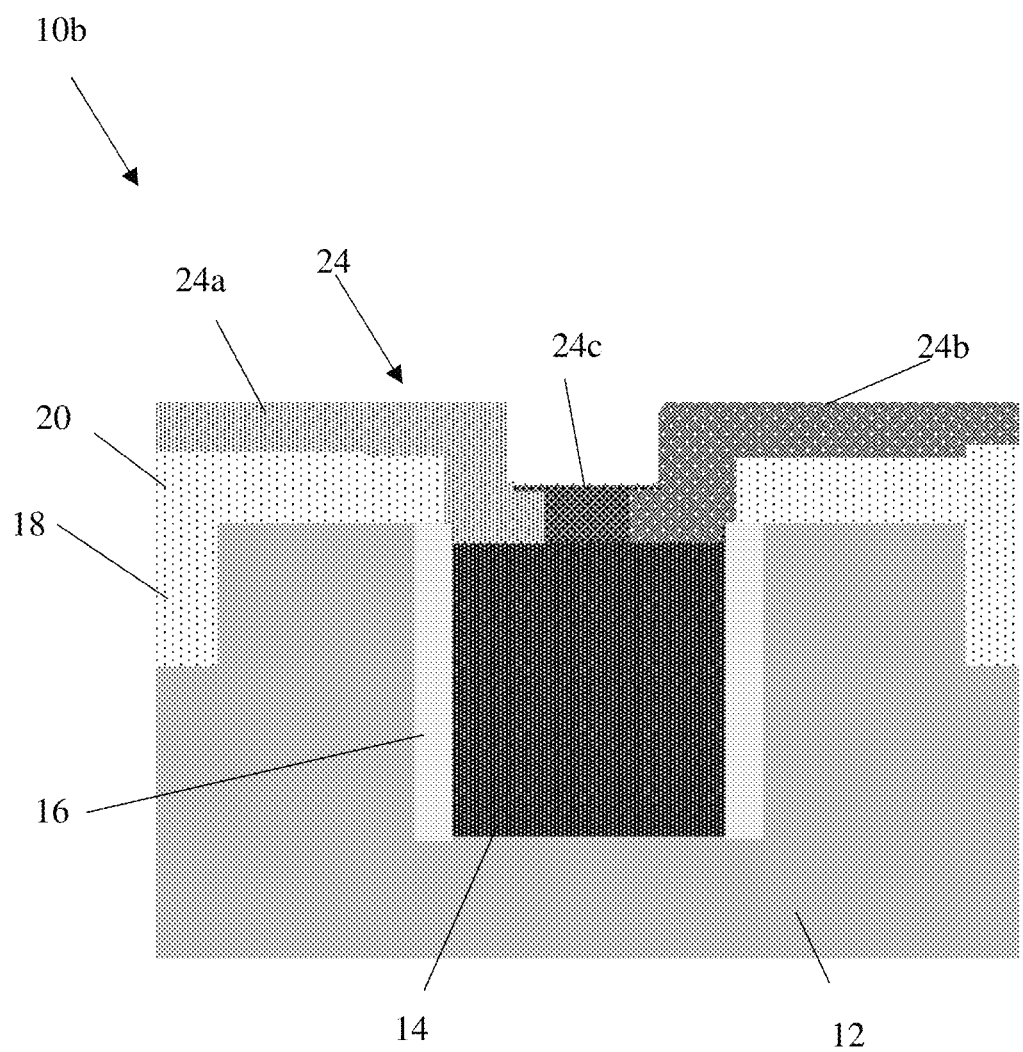
FIG. 3 shows a photodetector without doped sidewalls in accordance with aspects of the present disclosure.

FIG. 3 shows a photodetector without doped sidewalls in accordance with aspects of the present disclosure. More specifically, as shown in FIG. 3, the structure 10b includes the photodetector 14 and the collar 16 surrounding the photodetector 14; however, in this embodiment, there is no dopant abutting the collar 16 or photodetector 14. The remaining features are similar to the structure 10 of FIG. 1.

Figure 4:
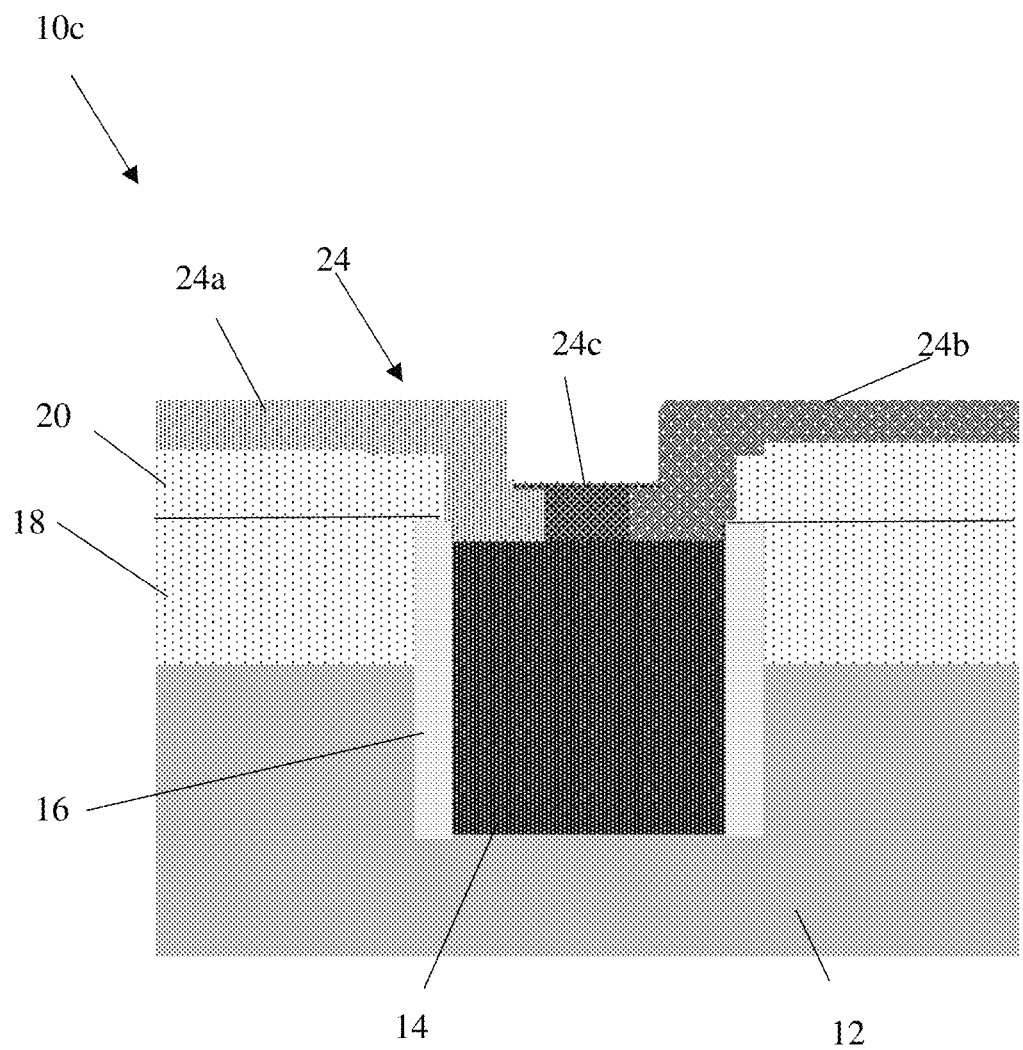
FIG. 4 shows a photodetector without doped sidewalls in accordance with additional aspects of the present disclosure.

FIG. 4 shows a photodetector without doped sidewalls in accordance with additional aspects of the present disclosure. More specifically, as shown in FIG. 4, the structure 10c includes the photodetector 14, the collar 16 surrounding the photodetector 14 and the isolation structures 18 abutting the collar 16. However, similar to the structure shown in FIG. 3, in this embodiment, there is no dopant abutting the collar 16 or photodetector 14. The remaining features are similar to the structure 10a of FIG. 2.

Figure 5A:
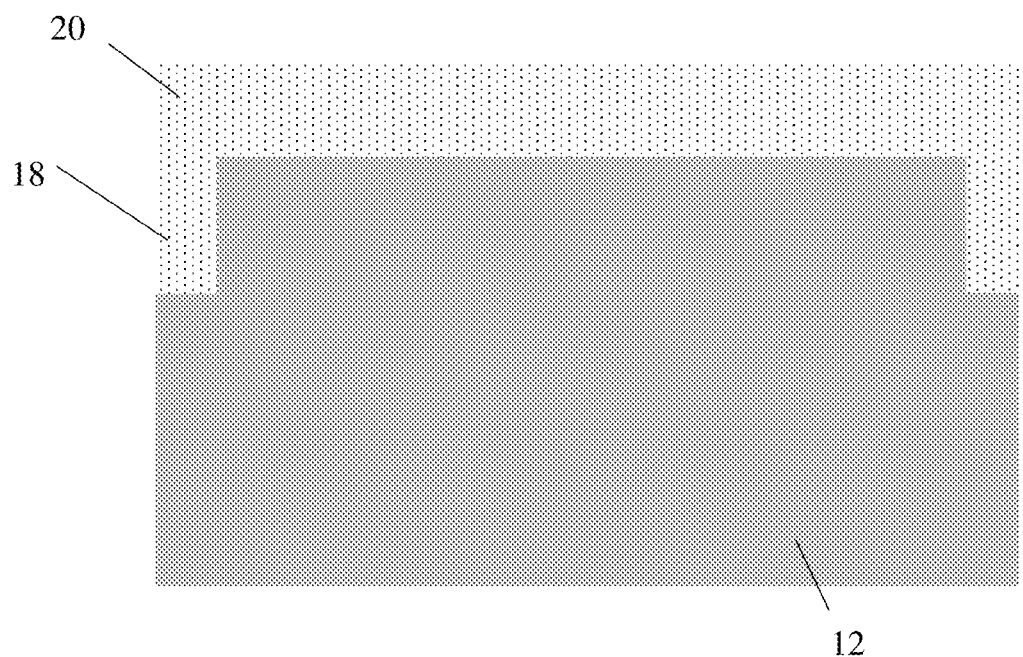
FIGS. 5A-5C show processing steps for fabricating the structure of FIG. 1 in accordance with aspects of the present disclosure.
Figure 5B:
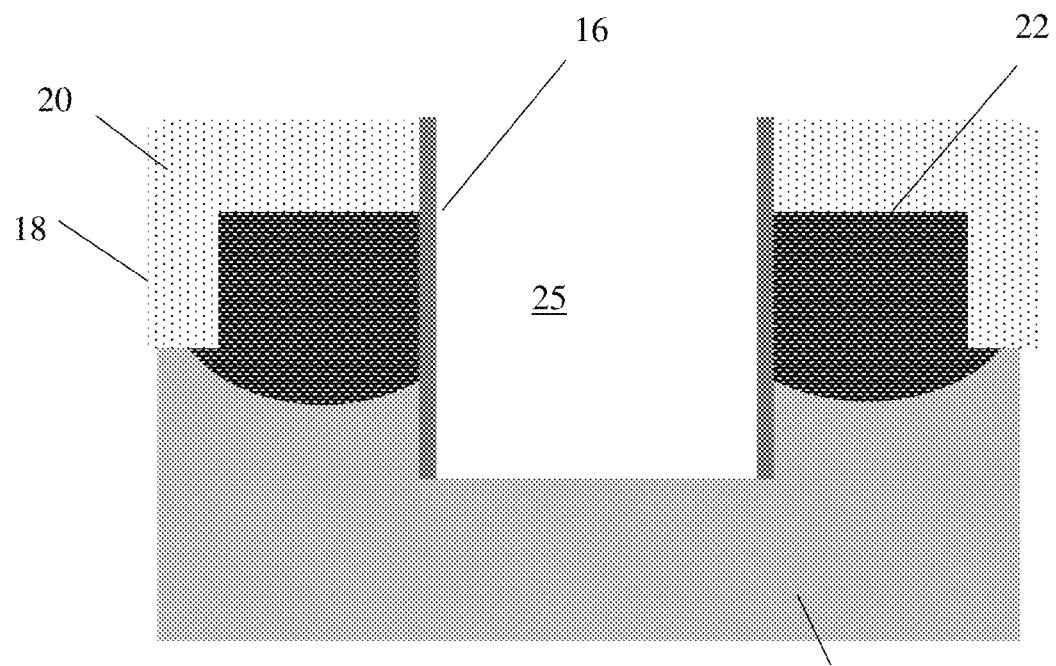
Figure 5C:
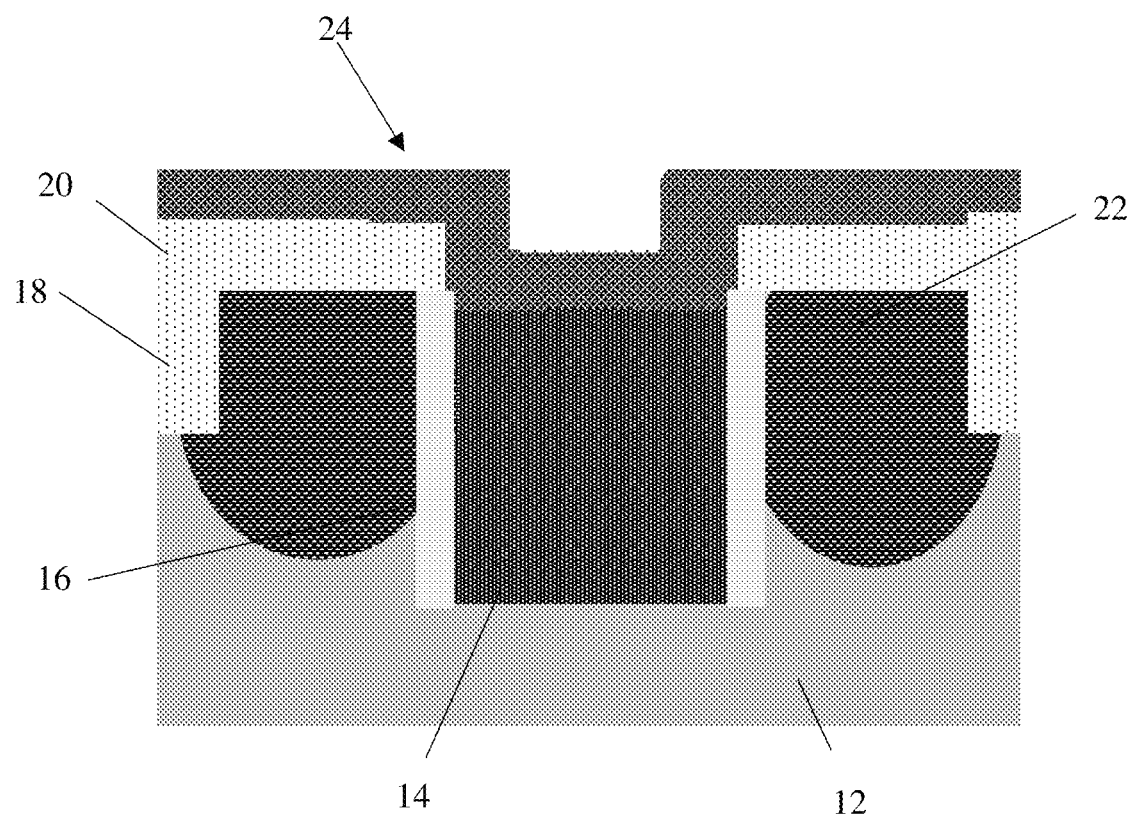

FIGS. 5A-5C show processing steps for fabricating the structure 10 of FIG. 1. In particular, FIG. 5A shows shallow trench isolation structures 18 formed in the semiconductor substrate 12 and the insulator material 20. The insulator material 20 may be formed by a conventional CVD process. In embodiments, the shallow trench isolation structures 18 can be formed by conventional lithography, etching and deposition methods known to those of skill in the art. For example, a resist formed over the semiconductor substrate 12 is exposed to energy (light) and developed to form a pattern (opening). An etching process with a selective chemistry, e.g., reactive ion etching (RIE), will be used to transfer the patter from the patterned photoresist to the semiconductor substrate 12 to form one or more trenches in the semiconductor substrate 12. Following the resist removal by a conventional oxygen ashing process or other known stripants, the insulator material (e.g., SiO$_2$) can be deposited by any conventional deposition processes, e.g., chemical vapor deposition (CVD) processes. Any residual material on the surface of the semiconductor substrate 12 can be removed by conventional chemical mechanical polishing (CMP) processes. It should be understood by those of skill in the art that the shallow trench isolation structures 18 can be larger by extending further inwards, e.g., shown in FIGS. 2 and 4, by providing a larger trench during the patterning step.

In FIG. 5B, a trench 25 may be formed in the semiconductor substrate 12 and insulator material 20 using conventional lithography and etching processes as described above. An insulator material 16 may be deposited on the structure, e.g., within the trench and insulator material 20 using a conventional deposition process, followed by an anisotropic etching process which includes a lateral etching component that etches the insulator material 16 on a bottom of the trench 26 and top surface of the insulator material 20. In this way, the insulator material 16 will form a collar on sidewalls of the trench 25. It should be understood by those of skill in the art that when the shallow trench isolation structures 18 are larger, they may extend to the collar on sidewalls of the trench 25.

In an optional embodiment, doped regions 22 may be formed in the semiconductor substrate 12. In embodiments, the doped regions 22 may be formed by conventional ion implantation processes as described in further detail below. The doped regions 22 may be formed prior to or after the formation of the trench 25 and/or shallow trench isolation structures 18, and may be composed of p or n dopants. The doping will be excluded in the embodiments shown in FIGS. 3 and 4.

In FIG. 5C, a semiconductor material is epitaxially grown within the trench 25 to form the photodetector 14. In embodiments, the semiconductor material may be Ge material. In embodiments, the Ge material will be grown from the bottom of the trench 25, upwards. This results in the photodetector 14 having a collar 16 which isolates the photodetector 14 from the doped regions 22.

Following the formation of the photodetector 14, a semiconductor material 24 may be epitaxially grown on the photodetector 14 and insulator material 20. The epitaxial growth process starts as a selective process on the photodetector 14 and continues as a non-selective process over the insulator material 20. As should be understood by those of skill in the art, the selective and non-selective processes result in a polysilicon material on the insulator material 20 and single crystalline (intrinsic) Si material on the photodetector 14. In embodiments, polysilicon may also be at the edges of the photodetector 14 due to the proximity of the insulator material 20.

Referring back to FIG. 1, the semiconductor material 24 may be subjected to ion implantation processes to form the doped regions 24a, 24b. During these ion implantation processes, the semiconductor material 24 over a portion of the photodetector 14 is masked and protected to maintain its intrinsic properties, e.g., intrinsic region 24c between the dual doped regions 24a, 24b.

In embodiments, the ion implantation processes introduce a concentration of different dopants of opposite conductivity type into the semiconductor material 24. In embodiments, respective patterned implantation masks may be used to define the selected areas 24a, 24b exposed for the implantations. The implantation mask used to select the exposed area for forming the P+ region 24a is stripped after implantation, and before the implantation mask used to form the N+ region 24b. Similarly, the implantation mask used to select the exposed area for forming the N+ region 24b is stripped after the implantation is performed. It should be understood that both masks may be used to overlap onto the intrinsic region 24c such that this region will not be subjected to any implantation processes. As is known in the art, the implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions.

The P+ region 24a is doped with p-type dopants, e.g., Boron (B), gallium, etc., and the N+ region 24b is doped with n-type dopants, e.g., Arsenic (As), Phosphorus (P) and Antimony (Sb), among other suitable examples. In embodiments, the intrinsic region 24c is between the P+ region 24a and N+ region 24b, each of which are provided over the photodetector 14. In this way, the P+ and N+ regions are separated by intrinsic silicon, above the photodetector 14.

The photodetector can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:
1. A structure comprising:
a photodetector; and
a semiconductor material on the photodetector, the semiconductor material comprising a first dopant type contacting a top surface of the photodetector, a second dopant type contacting the top surface of the photodetector and intrinsic semiconductor material contacting the top surface of the photodetector and separating the first dopant type from the second dopant type.
2. The structure of claim 1, wherein the first dopant type comprises a P+ dopant type and the second dopant type comprises an N+ dopant type.
3. The structure of claim 2, wherein the intrinsic semiconductor material comprises Si material.
4. The structure of claim 3, wherein the N+ dopant type and the P+ dopant type comprise polysilicon/silicon material over the photodetector.
5. The structure of claim 3, wherein the photodetector comprises Ge material.
6. The structure of claim 1, wherein the semiconductor material directly contacts the top surface of the photodetector.
7. The structure of claim 6, wherein the semiconductor material comprises epitaxial semiconductor material directly contacting the top surface of the photodetector.
8. The structure of claim 7, further comprising an insulator material directly under and contacting a bottom surface of the epitaxial semiconductor material.
9. The structure of claim 8, wherein the photodetector is within a trench of a semiconductor substrate, a collar is on sidewalls of the trench and the insulator material is on the semiconductor substrate and under the semiconductor material on sides of the photodetector.
10. The structure of claim 1, further comprising an insulator collar abutting sidewalls of the photodetector.
11. The structure of claim 10, further comprising dopant regions on sides of the insulator collar, which isolates the dopant regions from the photodetector.
12. A structure comprising:
a semiconductor substrate;
an insulator material over the semiconductor substrate;
a photodetector within a trench of the semiconductor substrate;
a semiconductor material of a first dopant type on a first portion of the photodetector and the insulator material;
a semiconductor material of a second dopant type on a second portion of the photodetector and the insulator material; and
an intrinsic semiconductor material contacting a third portion of the photodetector between the semiconductor material of the first dopant type and the semiconductor material of the second dopant type.
13. The structure of claim 12, wherein the first dopant type comprises P+ dopant type, the second dopant type comprises an N+ dopant type and the intrinsic semiconductor material is between the semiconductor material of the first dopant type and the semiconductor material of the second dopant type.
14. The structure of claim 12, further comprising an insulator collar lining the trench.
15. The structure of claim 14, further comprising doped regions within the semiconductor substrate, which are isolated from the photodetector by the insulator collar lining the trench.
16. The structure of claim 12, wherein the first portion is a first side, the second portion is a second side, and the third portion is between the first side and the second side.
17. The structure of claim 12, wherein the semiconductor material of the first dopant type and the semiconductor material of the second dopant type extend over and are in direct contact with the insulator material and in direct contact with the photodetector.
18. The structure of claim 12, wherein the photodetector comprises Ge material and the intrinsic semiconductor material comprises Si material.
19. The structure of claim 18, wherein the first dopant type, the second dopant type and the intrinsic semiconductor material comprise a PIN diode.
20. A method comprising:
forming a photodetector in a semiconductor substrate; and forming a semiconductor material on the photodetector, the semiconductor material comprising a first dopant type contacting a top surface of the photodetector, a second dopant type contacting the top surface of the photodetector and intrinsic semiconductor material contacting the top surface of the photodetector and separating the first dopant type from the second dopant type.

* * * * *